United States Patent [19]

Kim

[11] Patent Number: 4,471,004

[45] Date of Patent: Sep. 11, 1984

[54] METHOD OF FORMING REFRACTORY METAL CONDUCTORS OF LOW RESISTIVITY

[75] Inventor: Manjin J. Kim, Schenectady, N.Y.

[73] Assignee: General Electric Company, Schenectady, N.Y.

[21] Appl. No.: 489,613

[22] Filed: Apr. 28, 1983

[51] Int. Cl.³ .......................... B05D 5/12; C23C 11/00
[52] U.S. Cl. ........................................ 427/88; 427/96; 148/6.3
[58] Field of Search .............. 427/88, 96, 91; 148/6.3, 6.31; 29/589, 590; 357/65

[56] References Cited

U.S. PATENT DOCUMENTS 3,577,275  5/1971  Kosco ............................... 427/88 X
3,785,862  1/1974  Grill ................................... 427/91 X Primary Examiner—John D. Smith
Assistant Examiner—K. E. Jaconetty
Attorney, Agent, or Firm—Julius J. Zaskalicky; James C. Davis, Jr.; Marvin Snyder

[57] ABSTRACT

The resistivity of a conductor of a refractory metal such as molybdenum is reduced by converting at least a portion of the conductor into a layer of molybdenum nitride in an atmosphere including ammonia at a temperature in the range from about 400° C. to about 850° C. and thereafter heating the conductor in an atmosphere including dry hydrogen in the range from about 950° C. to about 1000° C. for a time to convert the layer of molybdenum nitride into molybdenum and to convert molybdenum oxides in the conductor into molybdenum.

15 Claims, 6 Drawing Figures

METHOD OF FORMING REFRACTORY METAL CONDUCTORS OF LOW RESISTIVITY

The present invention relates in general to forming refractory metals of low resistivity on substrates and in particular to a method of forming molybdenum conductors of low resistivity in integrated circuit devices.

This application is related to patent application Ser. No. 489,614, now abandoned filed concurrently herewith and assigned to the assignee of the present application.

As the density of circuit elements in integrated circuits and the speed of operation thereof is increased, the resistivity of the conductive materials utilized in the electrodes and the interconnection lines must be decreased to maintain low resistance in the electrodes and the conductive lines as the size thereof is reduced. Polycrystalline silicon semiconductor material suitably doped has heretofore been utilized as an electrode and as an interconnection line material as it is compatible with the making of integrated circuit devices on silicon substrates. The resistivity of such material even when doped cannot be normally reduced below a certain minimum resistivity of about $5 \times 10^{-4}$ ohm-cm. Thus, the usefulness of such a material for electrodes and interconnection lines in high density integrated circuits is limited. Refractory metals, such as molybdenum, have been used for first level electrodes and interconnection lines in integrated circuits as well as for the gate electrodes for the MOSFET devices thereof. While molybdenum in sheet form has a suitably lower resistivity, its resistivity being about $7.1 \times 10^{-6}$ ohm-cm, than doped polycrystalline silicon in the same form, its resistivity is degraded during the deposition of molybdenum on substrates and the subsequent processing of the substrates into integrated circuits. In the deposition of molybdenum onto substrates by sputtering or evaporation in high vacuum, residual water vapor and other contaminants present in the atmosphere of reduced pressure cause contamination of the molybdenum and increase the resistivity thereof. Also, in the processing of substrates on which molybdenum conductors and electrodes have been formed, oxygen and water vapor in the various environments to which the molybdenum conductors and electrodes are subjected contaminate the molybdenum and increase the resistivity thereof.

The present invention is directed to a method of processing conductors of refractory metals such as molybdenum and tungsten in the fabrication of integrated circuits therewith which overcome the problems and difficulties mentioned above.

An object of the present invention is to provide conductors of a refractory metal such as molybdenum and tungsten, of resistivities close to their bulk resistivities.

Another object of the present invention is to provide conductors of a refractory metal, such as molybdenum or tungsten, of a low and uniform resistivity.

In carrying out the method of the present invention, in accordance with one embodiment thereof, a substrate of silicon semiconductor material having an overlying layer of an insulating material is provided. A layer of molybdenum is deposited on the substrate and patterned to form a conductor. The conductor contains oxides of molybdenum which raise the resistivity thereof. The substrate including the conductor of molybdenum is heated in an atmosphere including ammonia at a temperature in the range from about 400° C. to about 850° C. for a time to cause the atmosphere to react with the conductor to convert the conductor of molybdenum into a body of molybdenum nitride of the same form as the conductor. Thereafter, the substrate including the body of molybdenum nitride is heated in an atmosphere including about 10% by volume of hydrogen and the remainder nitrogen at a temperature in the range from about 950° C. to about 1000° C. for a time to convert the body of molybdenum nitride into another conductor of molybdenum of the same form as the body of molybdenum nitride. The resistivity of the other conductor of molybdenum is substantially less than the resistivity of the first conductor of molybdenum first formed on the substrate.

The novel features which are believed to be characteristic of the present invention are set forth with particularity in the appended claims. The invention itself, both as to its organization and method of operation, together with further objects and advantages thereof, may best be understood by reference to the following description taken in connection with the accompanying drawings wherein:

Figure 1:
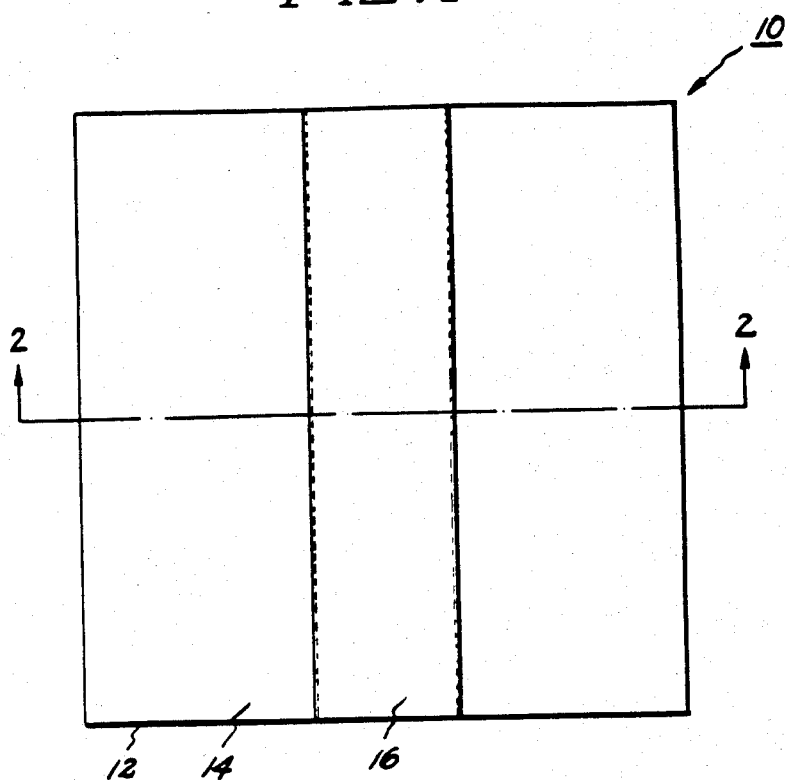
FIG. 1 is a plan view of a composite body including an insulating substrate on which is formed a first level of metallization of molybdenum in accordance with the present invention.

Referring now to FIG. 1, there is shown a composite body 10 illustrating a first level conductor 16 of molybdenum provided in accordance with the present invention. The composite body 10 incudes a substrate 13 of silicon semiconductor material on which a layer 14 of silicon dioxide has been formed. The layer 14 may represent either gate or field oxide of an integrated circuit such as an imaging array, a memory array or a signal or a data processing circuit. Overlying the insulating layer 14 gstroms, by sputtering molybdenum and thereafter patterning the layer by photoresist masking and etching techniques well known in the art to form a conductor. Thereafter, the conductor is converted into a body of molybdenum nitride by reacting the conductor with ammonia at a temperature in the range from about 400° C. to about 850° C. for a sufficient period of time. The process of forming molybdenum nitride on a conductor of molybdenum is described in patent application Ser. No. 362,682, filed March 29, 1982 now U.S. Pat. No. 4,429,011 and assigned to the assignee of the present application. The body of molybdenum nitride is then exposed to an atmosphere including about 10% by volume of hydrogen and the remainder nitrogen at a temperature in the range from about 950° C. to about 1000° C. for a time to convert the body of molybdenum nitride into the conductor 16 of molybdenum of the same form as the body of molybdenum nitride and having a resistivity substantially less than the resistivity of the conductor of molybdenum initially formed on the substrate.

Figure 2:
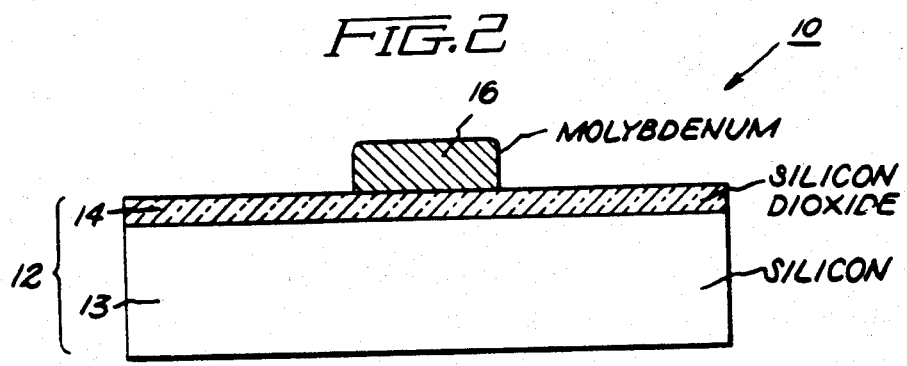
FIG. 2 is a cross-sectional view of the body of FIG. 1 taken along section lines 2—2 thereof.
Figure 3A:
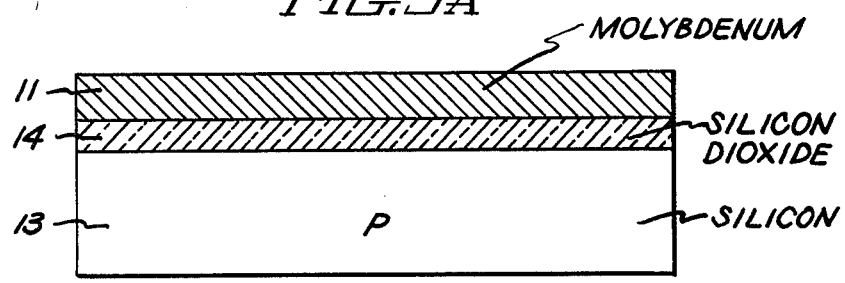
FIGS. 3A–3D show cross sections of structures representing successive steps in one method of fabricating a composite structure of FIGS. 1 and 2 in accordance with the present invention.
Figure 3B:
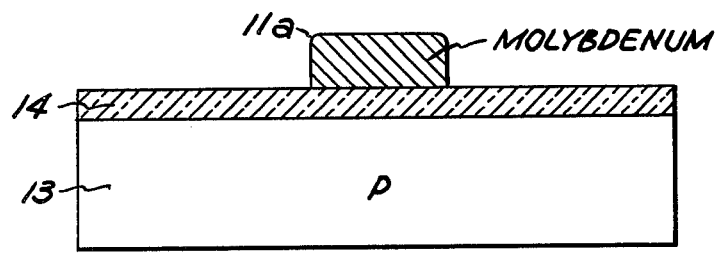
Figure 3C:
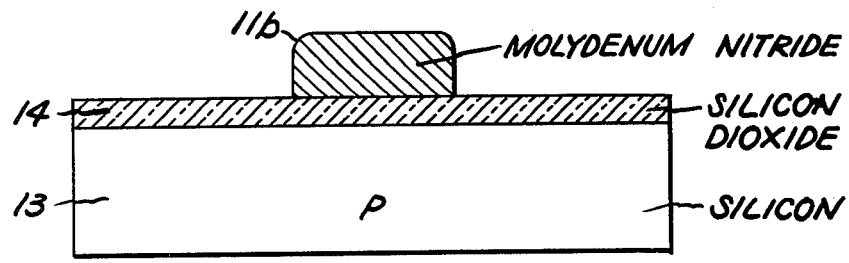

A method of fabricating the composite structure of FIGS. 1 and 2 will now be described in connection with FIGS. 3A–3D. The elements of FIGS. 3A–3D identical to the elements of FIGS. 1 and 2 are identically designated. A substrate of P-type silicon semiconductor material about 18 mils thick having a resistivity of 10 ohm-cm and a major surface oriented parallel to the (100) plane of the cyrstal is provided. The substrate is cleaned and thereafter oxidized at 1000° C. in dry oxygen to grow a layer of silicon dioxide thereon 1000 Angstroms thick. The structure is then annealed in nitrogen at 1000° C. for 30 minutes to reduce oxide charge. A film or layer 11 of molybdenum 3000 Angstroms thick is then sputtered in an argon atmosphere at reduced pressure of $3 \times 10^{-6}$ Torr on the layer of silicon dioxide using one form of conventional sputtering apparatus. In this apparatus, the layer 11 of molybdenum 3000 Angstroms thick was formed in about 3 minutes. Also, in this apparatus the substrate is heated to about 250° C. to promote adhesion of the molybdenum to the layer of silicon dioxide. The layer of molybdenum is then patterned using photolithographic masking and etching techniques well known in the art to provide a conductor 11a, one micron wide, as shown in FIG. 3B. In the patterning of the layer of molybdenum a positive resist is utilized. The exposed portions of the molybdenum layer are etched in Pawn etch consisting of 15 parts of nitric acid, 30 parts acetic acid, 38 parts of phosphoric acid and 75 parts of water by volume. Thereafter the resist is stripped in acetone and the molybdenum conductor 11a is cleaned in hot phosphoric acid. The resistivity was measured and found to be about $11 \times 10^{-6}$ ohm-cm. The substrate is next placed in a horizontal open tube furnace in which a flow stream of ammonia and nitrogen in the ratio of 10% by volume of ammonia and the remainder in nitrogen flowing at a rate of 2 liters per minute is established. The substrate is moved into a zone of the furnace in which a temperature of about 750° C. is provided. The substrate is exposed to the flow of ammonia and nitrogen in the furnace for a period of 10 minutes after which it is removed from the furnace. The conductor of molybdenum is completely converted into a body 11b of molybdenum nitride of about 3600 Angstroms thick as shown in FIG. 3C. The body 11b of molybdenum nitride formed is smooth, physically strong and has a high metallic luster. The layer of molybdenum nitride has a composition given by the formula $Mo_2N$ and is a mixed phase consisting of crystallites of face centered cubic and face centered tetragonal cells.

Figure 3D:
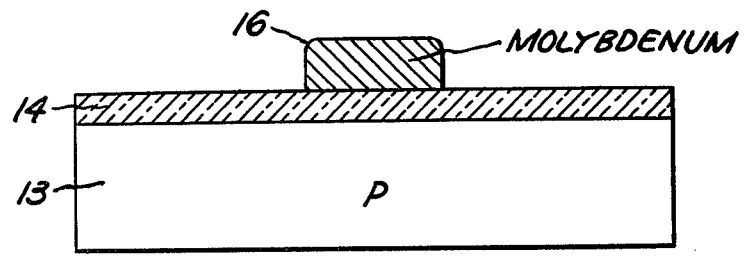

The substrate is then placed in a horizontal open tube furnace in which a flow stream of hydrogen and nitrogen in the ratio of 10% by volume of hydrogen and the remainder nitrogen flowing at a rate of 2.5 liters per minute is established. The substrate is moved into a zone of the furnace in which a temperature of about 1000° C. is provided. The substrate is exposed to the flow of hydrogen and nitrogen in the furnace for a period of 6 minutes. The hydrogen and nitrogen prior to passage into the furnace had been thoroughly dried removing substantially all of the water vapor therein by passage of the gases through liquid nitrogen traps. The body of molybdenum nitride formed is completely converted back into a conductor 16 of molybdenum about 3000 Angstroms thick as shown in FIG. 3D. The resistivity of the conductor of molybdenum was measured and found to be approximately $7.1 \times 10^{-6}$ ohm-cm, substantially lower than the resistivity of the conductor of molybdenum initially formed by sputter deposition.

When the step of converting the molybdenum conductor into a body of molybdenum nitride in the above described example is eliminated, it was found that the resistivity of the conductor of molybdenum was lowered to approximately $8.2 \times 10^{-6}$ ohm-cm, still substantially lower than the resistivity of the deposited conductor of molybdenum but appreciably greater than the resistivity obtained utilizing the nitriding step. The process of lowering the resistivity of a conductor of molybdenum which avoids the nitriding step is described and claimed in copending patent application Ser. No. 489,614 mentioned above.

In the reaction of the body of molybdenum nitride with the hydrogen atmosphere, molybdenum oxide is reduced to molybdenum and water in accordance with the following equation:

$$\tfrac{1}{2} MoO_2 \text{ (solid)} + H_2 \text{ (gas)} = \tfrac{1}{2} Mo \text{ (solid)} + H_2O \text{ (gas)} \quad (1)$$

At equilibrium at a specific temperature, the ratio of the partial pressure of hydrogen to the partial pressure of water vapor has a specific value. If the partial pressure of the hydrogen in the reducing atmosphere exceeds the partial presure of the water vapor at equilibrium, the molybdenum dioxide is converted into molybdenum and water vapor. Of course, the greater the ratio of the partial pressure of hydrogen to the partial pressure of water vapor in excess of the equilibrium ratio, the greater is the rate of conversion of molybdenum dioxide to molybdenum and water vapor.

In this process the decomposition of molybdenum nitride and the concurrent reducing action of hydrogen enables a low and uniform value of resistivity to be obtained in the conductor of molybdenum.

When the temperature of the reaction to convert molybdenum to molybdenum nitride is lowered the conversion of molybdenum into molybdenum nitride proceeds at a slower rate. When the reaction temperature is raised the conversion of molybdenum into molybdenum nitride proceeds at a faster rate.

Reaction temperatures in the range from about 400° C. to about 750° C. produced molybdenum nitride having a composition given by the formula $Mo_2N$. Molybdenum nitride of the composition given by the formula $Mo_2N$ consists of crystallites of face centered cubic and faced centered tetragonal cells. A layer of the molybdenum nitride formed on a conductor of molybdenum blocks the passage of implantation and mobile ions therethrough, and also reduces the formation of oxides thereon and the erosion of the molybdenum by various chemical agents, such as nitric acid, and hydrogen peroxide, utilized in fabrication of integrated structures utilizing molybdenum conductors. Reaction temperatures in the range from about 750° C. to about 850° C. produce molybdenum nitride including components having the composition of $MoN$ as well as $Mo_2N$. The $MoN$ component is constituted of crystallites of hexagonal cells. The layer of molybdenum nitride formed in the range from about 750° C. to 850° C. is smooth, has a metallic luster and is strongly adherent to the molybdenum conductor. Thus, nitrides of molybdenum formed at temperatures below about 850° C. provide the protective and ion implantation masking functions mentioned above as well as constituting a step in the process for lowering the resistivity of conductors of molybdenum. At reaction temperatures above about 850° C. the layer of molybdenum nitride is constituted of $MoN$. This layer of molybdenum nitride is brittle, irregular in form, lacks metallic luster and has poor adhesion qualities.

While ammonia and nitrogen in the proportions of 10% ammonia and the remainder nitrogen by volume are utilized, other proportions of ammonia greater or less than 10% may be utilized. With a greater percentage of ammonia the formation of molybdenum nitride proceeds at a faster rate and with a smaller percentage of ammonia the formation of molybdenum nitride proceeds at a slower rate.

While in the example described above the conductor of molybdenum is completely converted into molybdenum nitride, the conductor could have been partially converted to molybdenum nitride, if desired, stopping the reaction before the molybdenum conductor is completely consumed.

While the ammonia was dilute with nitrogen other diluents may be utilized, for example, gases of the eighth column of the Periodic Table of Elements, such as argon, helium and neon.

While in the process of conversion of the body of molybdenum nitride into molybdenum, an atmosphere of about 10% of hydrogen by volume and the remainder nitrogen was utilized, a greater or smaller percentage of hydrogen could have been utilized. Also, while the carrier gas utilized was nitrogen, other inert carrier gases such as argon, helium and neon could have been used. Also, while a temperature of about 1000° C. was utilized to effect the conversion of molybdenum nitride to molybdenum, higher or lower temperatures may be utilized with consequent lesser and greater times respectively required for the complete conversion of molybdenum nitride into molybdenum. While a temperature of about 1000° C. was utilized for the decomposition of $Mo_2N$, temperatures starting at about 950° C. could have been utilized for the decomposition of $Mo_2N$. Decomposition of MoN requires a temperature of about 1000° C.

Raising the temperature of conductors of molybdenum including molybdenum nitride thereon to the range of about 950° C. to about 1000° C. causes the decomposition of molybdenum nitride into molybdenum which forms grains of body centered cubic crystals in a columnar structure. The oxides of molybdenum contained within the body of molybdenum are believed to be included in the boundaries between grains. The presence of hydrogen at high temperatures reduces the oxides and thereby lowers resistance across the grain boundaries of molybdenum.

While the layer 14 of insulating material on which the conductive member 11 of molybdenum was formed is silicon dioxide, it is apparent that the insulating layer may be constituted of any of a number of materials such as silicon nitride, or a layer of silicon nitride overlying a layer of silicon dioxide or combinations thereof. While the conductive member 11 of molybdenum was formed on a layer 14 of insulating material, it is apparent that the conductive member of molybdenum may be formed on substrates of other materials, such as semiconductor materials, for example silicon, and such as conductive materials, for example platinum or titanium.

While molybdenum conductors were formed from a layer of molybdenum which was sputtered onto a substrate, other processes, such as evaporation and chemical vapor deposition, could have been used to form the layer of molybdenum.

In the process of incorporating molybdenum in the form of conductors and electrodes in integrated circuit devices, the molybdenum can be deposited by a variety of means and conditions on various substrates of the integrated circuit, and also is subject to various environments and temperatures in the various steps of forming the integrated circuit. The resistivity of molybdenum varies depending on the conditions of deposition and subsequent treatment. The processing to which a molybdenum conductor is subjected to in accordance with the present invention provides not only a low resultant resistivity but also a uniform resultant resistivity regardless of the prior conditions to which the molybdenum conductor was subjected.

While the process in accordance with the present invention has been described in the examples above in connection with molybdenum, the process with minor variations in times and temperatures is equally applicable to the refractory metal tungsten which is very similar to molybdenum in physical and chemical properties.

While the invention has been described in a specific embodiment, it will be understood that modifications, such as those described above, may be made by those skilled in the art and it is intended by the appended claims to cover all such modifications and changes as fall within the true spirit and scope of the invention.

What is claimed is:

1. A method of lowering the resistivity of a conductor of a refractory metal comprising:
providing a substrate,
providing a conductor of a refractory metal selected from the class consisting of molybdenum and tungsten on said substrate, said conductor containing oxides of said refractory metal which raises the resistivity thereof,
heating said substrate including said conductor in an atmosphere including ammonia at a temperature in the range from about 400° C. to about 850° C. for a time to cause said atmosphere to react with said conductor to convert at least a portion of said conductor into a layer of molybdenum nitride,
heating said substrate and said conductor with said layer of refractory nitride thereon in an atmosphere of hydrogen substantially devoid of water vapor at a temperature in the range from about 950° to about 1000° C. for a time to convert said layer of refractory nitride into a layer of refractory metal and to convert a substantial portion of said oxides of said refractory metal into refractory metal whereby the resistivity of said conductor is reduced.

2. The method of claim 1 in which said refractory metal is molybdenum.

3. The method of claim 1 in which said refractory metal is tungsten.

4. The method of claim 2 in which said conductor is heated in said atmosphere of ammonia at a temperature in the range from about 400° C. to about 750° C. for a time to react with said conductor to convert at least a portion of said conductor into a layer of molybdenum nitride having the composition $Mo_2N$.

5. The method of claim 2 in which said substrate including said conductor is heated in an atmosphere of ammonia at a temperature in the range from about 750° to 850° C. for a time to cause said atmosphere to react with said conductor to convert at least a portion of said conductor into a layer of molybdenum nitride including the constituents $Mo_2N$ and MoN.

6. The method of claim 1 in which said atmosphere of ammonia consists of ammonia and an insert gas.

7. The method of claim 6 in which said relatively inert gas is nitrogen.

8. The method of claim 7 in which said atmosphere of ammonia consists of about 10% of ammonia by volume and the remainder nitrogen.

9. The method of claim 1 in which said atmosphere of hydrogen consists of hydrogen and an inert gas.

10. The method of claim 9 in which said relatively inert gas is nitrogen.

11. The method of claim 10 in which said atmosphere of ammonia consists of about 10% hydrogen by volume and the remainder nitrogen.

12. The method of claim 1 in which said atmosphere of hydrogen is caused to flow over said conductor of refractory metal.

13. The method of claim 1 in which said substrate is constituted of an insulating material.

14. The method of claim 1 in which said substrate is constituted of a semiconductor material.

15. The method of claim 1 in which said substrate is constituted of a conductive material.

* * * * *